(12) United States Patent
Long

(10) Patent No.: US 11,552,070 B2
(45) Date of Patent: Jan. 10, 2023

(54) ELECTROSTATIC PROTECTION CIRCUIT, ARRAY SUBSTRATE AND DISPLAY DEVICE

(71) Applicant: BOE Technology Group Co., Ltd., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 282 days.

(21) Appl. No.: 16/642,606

(22) PCT Filed: Aug. 27, 2019

(86) PCT No.: PCT/CN2019/102895
§ 371 (c)(1),
(2) Date: Feb. 27, 2020

(87) PCT Pub. No.: WO2020/103510
PCT Pub. Date: May 28, 2020

(65) Prior Publication Data
US 2021/0043621 A1 Feb. 11, 2021

(30) Foreign Application Priority Data
Nov. 23, 2018 (CN) .......................... 201821948211.8

(51) Int. Cl.
*H01L 27/02* (2006.01)
*G09G 3/20* (2006.01)

(52) U.S. Cl.
CPC .......... *H01L 27/0248* (2013.01); *G09G 3/20* (2013.01); *H01L 27/0255* (2013.01); *H01L 27/0259* (2013.01); *G09G 2330/045* (2013.01)

(58) Field of Classification Search
CPC ............. H01L 27/0248; H01L 27/0266; H01L 27/0296; H01L 27/02; H01L 27/12;
(Continued)

(56) References Cited
U.S. PATENT DOCUMENTS 6,365,941 B1 * 4/2002 Rhee .................... H01L 27/0266
438/223
6,465,768 B1 * 10/2002 Ker ..................... H01L 27/0277
250/214.1
(Continued)

FOREIGN PATENT DOCUMENTS

CN 1402358 A 3/2003
CN 102054837 A 5/2011
(Continued)

*Primary Examiner* — S M Sohel Imtiaz
(74) *Attorney, Agent, or Firm* — ArentFox Schiff LLP; Michael Fainberg

(57) ABSTRACT

Disclosed is an electrostatic protection circuit, an array substrate and a display device. The electrostatic protection circuit includes a first electrostatic discharge end, a second electrostatic discharge end and a signal line connecting end; a first discharge sub-circuit coupled between the first electrostatic discharge end and the signal line connecting end; and a second discharge sub-circuit coupled between the second electrostatic discharge end and the signal line connecting end. Each of the first discharge sub-circuit and the second discharge sub-circuit comprises at least one MOSFET, and gates of all MOSFETs comprised in the first discharge sub-circuit and the second discharge sub-circuit are not coupled with any one of the first electrostatic discharge end, the second electrostatic discharge end and the signal line connecting end.

17 Claims, 8 Drawing Sheets

(58) Field of Classification Search
CPC ... H01L 27/0255; H01L 27/0259; G09G 3/20; G09G 2330/045; G09G 2330/04
See application file for complete search history.

(56) References Cited

U.S. PATENT DOCUMENTS

| | | | |
|---|---|---|---|
| 2002/0027755 A1* | 3/2002 | Andresen | H01L 27/0251 361/56 |
| 2004/0218322 A1* | 11/2004 | Chen | H01L 27/0285 361/56 |
| 2007/0034969 A1* | 2/2007 | Wang | H01L 21/823418 438/300 |
| 2007/0090414 A1* | 4/2007 | Sutou | H01L 29/0696 257/277 |
| 2012/0062271 A1* | 3/2012 | Bawolek | G09G 3/006 324/555 |
| 2015/0160522 A1* | 6/2015 | Wu | H02H 9/045 349/40 |

FOREIGN PATENT DOCUMENTS

| | | | |
|---|---|---|---|
| CN | 103944154 A | 7/2014 | |
| CN | 209150116 A | 7/2019 | |
| JP | 2011159914 A | 8/2011 | |
| JP | 2016058423 A | 4/2016 | |

\* cited by examiner

US 11,552,070 B2

ELECTROSTATIC PROTECTION CIRCUIT, ARRAY SUBSTRATE AND DISPLAY DEVICE

CROSS REFERENCE TO RELATED APPLICATIONS

This application is a US National Stage of International Application No. PCT/CN2019/102895, filed on Aug. 27, 2019, which claims priority to Chinese Patent Application No. 201821948211.8, filed with Chinese Patent Office on Nov. 23, 2018, entitled "Electrostatic Protection Circuit, Array Substrate and Display Device", the entire content of which is incorporated herein by reference.

FIELD

The present disclosure relates to the technical field of display and in particular relates to an electrostatic protection circuit, an array substrate and a display device.

BACKGROUND

Flat panel display technique is widely applied to television, mobile phone and common information display. However, the flat panel display is possibly damaged by static electricity in a manufacturing process or a using process.

Electrostatic accumulation and discharge are one of the main factors causing damage to a device in the semiconductor field. In the manufacturing process of related displays, it is liable for function lines such as gate lines and data lines in a wiring-intensive region to generate electrostatic accumulation, causing a transistor to breakdown and thus fail to work. Therefore, how to effectively discharge static electricity accumulated on the function lines fast is a technical problem for those skilled in the art to solve urgently.

SUMMARY

An embodiment of the present disclosure provides an electrostatic protection circuit, including:

a first electrostatic discharge end, a second electrostatic discharge end and a signal line connecting end;

a first discharge sub-circuit coupled between the first electrostatic discharge end and the signal line connecting end; and a second discharge sub-circuit coupled between the second electrostatic discharge end and the signal line connecting end;

where the first discharge sub-circuit and the second discharge sub-circuit each includes at least one transistor, and gates of all transistors included in the first discharge sub-circuit and the second discharge sub-circuit are not coupled with any one of the first electrostatic discharge end, the second electrostatic discharge end and the signal line connecting end.

Optionally, in the above electrostatic protection circuit provided by the embodiment of the present disclosure, the first discharge sub-circuit includes a first transistor and a second transistor, a source electrode of the first transistor is coupled with the first electrostatic discharge end, a source electrode of the second transistor is coupled with the signal line connecting end, and a drain electrode of the first transistor is connected in series with a drain electrode of the second transistor to form a first common drain electrode.

Optionally, in the above electrostatic protection circuit provided by the embodiment of the present disclosure, the gate of the first transistor and the gate of the second transistor are both coupled with the first common drain electrode.

Optionally, in the above electrostatic protection circuit provided by the embodiment of the present disclosure, the gate of the first transistor and the gate of the second transistor are both floating.

Optionally, in the above electrostatic protection circuit provided by the embodiment of the present disclosure, the gate of the first transistor is coupled with the first common drain electrode, and the gate of the second transistor is floating.

Optionally, in the above electrostatic protection circuit provided by the embodiment of the present disclosure, the gate of the first transistor is floating, and the gate of the second transistor is coupled with the first common drain electrode.

Optionally, in the above electrostatic protection circuit provided by the embodiment of the present disclosure, the second transistor is an N-type transistor, and ion doping concentration of an active layer of the first transistor is greater than ion doping concentration of an active layer of the second transistor.

Optionally, in the above electrostatic protection circuit provided by the embodiment of the present disclosure, the first transistor is an N-type transistor, the second transistor is a P-type transistor, the first electrostatic discharge end is coupled with a low potential reference voltage line, and the second electrostatic discharge end is coupled with a high potential reference voltage line.

Optionally, in the above electrostatic protection circuit provided by the embodiment of the present disclosure, the first transistor is an N-type transistor, the second transistor is an N-type transistor, the first electrostatic discharge end is coupled with the high potential reference voltage line, and the second electrostatic discharge end is coupled with the low potential reference voltage line.

Optionally, in the above electrostatic protection circuit provided by the embodiment of the present disclosure, the first transistor is a P-type transistor, and ion doping concentration of the active layer of the second transistor is greater than ion doping concentration of the active layer of the first transistor.

Optionally, in the above electrostatic protection circuit provided by the embodiment of the present disclosure, the second discharge sub-circuit includes a third transistor and a fourth transistor, a source electrode of the third transistor is coupled with the signal line connecting end, a source electrode of the fourth transistor is coupled with the second electrostatic discharge end, and a drain electrode of the third transistor is connected in series with a drain electrode of the fourth transistor to form a second common drain electrode.

Optionally, in the above electrostatic protection circuit provided by the embodiment of the present disclosure, the gate of the third transistor and the gate of the fourth transistor are both coupled with the second common drain electrode.

Optionally, in the above electrostatic protection circuit provided by the embodiment of the present disclosure, the gate of the third transistor and the gate of the fourth transistor are both floating.

Optionally, in the above electrostatic protection circuit provided by the embodiment of the present disclosure, the gate of the third transistor is coupled with the second common drain electrode, and the gate of the fourth transistor is floating.

Optionally, in the above electrostatic protection circuit provided by the embodiment of the present disclosure, the gate of the third transistor is floating, and the gate of the fourth transistor is coupled with the second common drain electrode.

Optionally, in the above electrostatic protection circuit provided by the embodiment of the present disclosure, the fourth transistor is an N-type transistor, and ion doping concentration of an active layer of the third transistor is greater than ion doping concentration of an active layer of the fourth transistor.

Optionally, in the above electrostatic protection circuit provided by the embodiment of the present disclosure, the third transistor is an N-type transistor, the fourth transistor is a P-type transistor, the first electrostatic discharge end is coupled with the low potential reference voltage line, and the second electrostatic discharge end is coupled with the high potential reference voltage line.

Optionally, in the above electrostatic protection circuit provided by the embodiment of the present disclosure, the third transistor is a P-type transistor, the fourth transistor is a P-type transistor, the first electrostatic discharge end is coupled with the high potential reference voltage line, and the second electrostatic discharge end is coupled with the low potential reference voltage line.

Optionally, in the above electrostatic protection circuit provided by the embodiment of the present disclosure, the third transistor is a P-type transistor, and ion doping concentration of the active layer of the fourth transistor is greater than ion doping concentration of the active layer of the third transistor.

Optionally, in the above electrostatic protection circuit provided by the embodiment of the present disclosure, the transistors with the high ion doping concentration are the N-type transistors or the P-type transistors, the first electrostatic discharge end is coupled with the low potential reference voltage line, and the second electrostatic discharge end is coupled with the high potential reference voltage line.

Optionally, in the above electrostatic protection circuit provided by the embodiment of the present disclosure, the first discharge sub-circuit includes the first transistor and the second transistor, the source electrode of the first transistor is coupled with the first electrostatic discharge end, the source electrode of the second transistor is coupled with the signal line connecting end, and the drain electrode of the first transistor is connected in series with the drain electrode of the second transistor to form the first common drain electrode;

the second discharge sub-circuit includes the third transistor and the fourth transistor, the source electrode of the third transistor is coupled with the signal line connecting end, the source electrode of the fourth transistor is coupled with the second electrostatic discharge end, and the drain electrode of the third transistor is connected in series with the drain electrode of the fourth transistor to form the second common drain electrode.

Optionally, in the above electrostatic protection circuit provided by the embodiment of the present disclosure, the gate of the first transistor and the gate of the second transistor are both coupled with the first common drain electrode, and the gate of the third transistor and the gate of the fourth transistor are both coupled with the second common drain electrode; or the gate of the first transistor and the gate of the second transistor are both floating, and the gate of the third transistor and the gate of the fourth transistor are both floating; or the gate of one transistor of the first transistor and the second transistor is coupled with the first common drain electrode, and the gate of the other transistor is floating; the gate of one transistor of the third transistor and the fourth transistor is in a suspension connection, and the gate of the other transistor is coupled with the second common drain electrode; or the gate of one transistor of the first transistor and the second transistor is coupled with the first common drain electrode, and the gate of the other transistor is floating; and the gates of the third transistor and the fourth transistor are both coupled with the second common drain electrode; or the gates of the first transistor and the second transistor are both coupled with the first common drain electrode; and the gate of one transistor of the third transistor and the fourth transistor is coupled with the second common drain electrode, and the gate of the other transistor is floating.

Correspondingly, the present disclosure further provides an array substrate, comprising a display area and a non-display area surrounding the display area, the display area includes signal lines, and the non-display area includes electrostatic protection lines and further includes the above any one electrostatic protection circuit provided by the embodiment of the present disclosure, where the signal line connecting end of the electrostatic protection circuit is coupled with the signal lines; and the first electrostatic discharge end and the second electrostatic discharge end of the electrostatic protection circuit are both coupled with the electrostatic protection lines.

Optionally, the above array substrate provided by the embodiment of the present disclosure includes a substrate and further includes a buffer layer, a semiconductor layer, a gate insulating layer, a first metal layer, an interlayer insulating layer, a second metal layer, a passivation layer and a planarization layer stacked on the substrate in that order, where the semiconductor layer includes the active layers of all the transistors, the first metal layer includes the gates of all the transistors, and the second metal layer includes the source electrodes and the drain electrodes of all the transistors;

the first common drain electrode or the second common drain electrode is coupled with the corresponding gates through via holes running through the interlayer insulating layer, and the source electrodes and the drain electrodes are respectively coupled with the corresponding active layers through via holes running through the interlayer insulating layer and the gate insulating layer.

Optionally, in the above array substrate provided by the embodiment of the present disclosure, the active layers of all the transistors are integrally structured and each transistor is a polycrystalline silicon transistor.

Optionally, in the above array substrate provided by the embodiment of the present disclosure, the extending direction of the source electrodes of all the transistors is disposed parallel with the signal lines and perpendicular to the electrostatic protection lines.

Optionally, in the above array substrate provided by the embodiment of the present disclosure, the signal lines include a gate line, a data line or a test signal line; and the electrostatic protection lines include a common electrode line, the high potential reference voltage line or the low potential reference voltage line.

Correspondingly, the present disclosure further provides a display device, comprising the above any one array substrate provided by the embodiment of the present disclosure.

DETAILED DESCRIPTION OF THE EMBODIMENTS

In order to make the objectives, technical solution and advantages of the present disclosure clearer, accompanying drawings will be incorporated below to describe in detail implementations of the electrostatic protection circuit, array substrate and display device provided by the embodiment of the present disclosure.

The thickness and shape of each layer of thin film in the accompanying drawings do not reflect a true scale of the electrostatic protection circuit, as they just aim to illustrate contents of the present disclosure.

Figure 1:
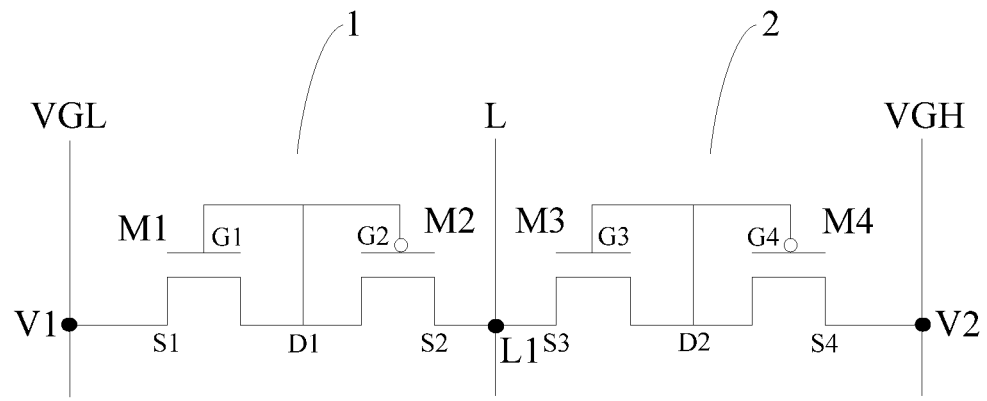
FIG. 1 is a schematic structure diagram of an electrostatic protection circuit provided by an embodiment of the present disclosure.

An electrostatic protection circuit provided by an embodiment of the present disclosure, as shown in FIG. 1, includes: a first electrostatic discharge end V1, a second electrostatic discharge end V2, a signal line connecting end L1, a first discharge sub-circuit 1 coupled between the first electrostatic discharge end V1 and the signal line connecting end, and a second discharge sub-circuit 2 coupled between the second electrostatic discharge end V2 and the signal line connecting end L1; where the first discharge sub-circuit 1 and the second discharge sub-circuit 2 each includes at least one transistor, and gates of all the transistors included in the first discharge sub-circuit 1 and the second discharge sub-circuit 2 are not coupled with any one of the first electrostatic discharge end V1, the second electrostatic discharge end V2 and the signal line connecting end L1.

Specifically, the first electrostatic discharge end V1 and the second electrostatic discharge end V2 in the electrostatic protection circuit provided by the embodiment of the present disclosure are respectively coupled with the same or different electrostatic protection lines, such as a common electrode line, a high-potential reference voltage and a low potential reference voltage lines; and the signal line connecting end L1 is coupled with signal lines, such as a gate line and a data line. When the voltage generated by the electrostatic charges accumulated on the signal lines is too large or too small (the absolute value is very large), the signal lines and the electrostatic protection lines can be conducted through the transistors in the first electrostatic discharge circuit 1 or in the second electrostatic discharge circuit 2, so that effective electrostatic discharge of the signal lines in a product can be realized without influencing the realization of normal functions of the product.

In an implementation, in the above electrostatic protection circuit provided by the embodiment of the present disclosure, as shown in FIGS. 1-8B, the first discharge sub-circuit 1 and the second discharge sub-circuit 2 each may include two transistors in series connection. Certainly, in an implementation, the first discharge sub-circuit 1 and the second discharge sub-circuit 2 each may include one or more transistors and the number of transistors included in the first discharge sub-circuit 1 and the second discharge sub-circuit 2 may be the same or different, as long as a coupling relationship is reasonably set to allow the, electrostatic discharge of the signal lines of the present disclosure, which belongs to the protection scope of the present disclosure.

It should be noted that in order to define the present disclosure better, the accompanying drawings of the electrostatic protection circuit provided by the embodiment of the present disclosure are illustratively described with respective coupling of the first electrostatic discharge end V1 and the second electrostatic discharge end V2 with the electrostatic protection line and coupling of the signal line connecting end L1 with the signal lines as the example.

First Embodiment

In an implementation, in the above electrostatic protection circuit provided by the embodiment of the present disclosure, in the first discharge sub-circuit 1 and the second discharge sub-circuit 2 each, the gates of the transistors may be coupled with the common drain electrode of the two transistors in series connection. Specifically, as shown in FIG. 1, in the first discharge sub-circuit 1, a gate G1 of a first transistor M1 and a gate G2 of a second transistor M2 are both coupled with the first common drain electrode D1 between the first transistor M1 and the second transistor M2 in series connection; in the second discharge sub-circuit 2, a gate G3 of a third transistor M3 and a gate G4 of a fourth transistor M4 are both coupled with the second common drain electrode D2 between the third transistor M3 and the fourth transistor M4 in series connection.

In an implementation, in the above electrostatic protection circuit provided by the embodiment of the present disclosure, as shown in FIG. 1, the first discharge sub-circuit 1 includes the first transistor M1 and the second transistor M2, a source electrode S1 of the first transistor M1 is coupled with the first electrostatic discharge end V1, the gate G1 of the first transistor M1 and the gate G2 of the second transistor M2 are both coupled with the first common drain electrode D1 between the first transistor M1 and the second transistor M2 in series connection, and a source electrode S2 of the second transistor M2 is coupled with the signal line connecting end L1;

the second discharge sub-circuit 2 includes the third transistor M3 and the fourth transistor M4, the gate G3 of the third transistor M3 and the gate G4 of the fourth transistor M4 are both coupled with the second common drain electrode D2 between the third transistor M3 and the fourth transistor M4 in series connection, a source electrode S3 of the third transistor M3 is coupled with the signal line connecting end L1, and a source electrode S4 of the fourth transistor M4 is coupled with the second electrostatic discharge end V2.

In an implementation, in the above electrostatic protection circuit provided by the embodiment of the present disclosure, as shown in FIG. 1, in the first discharge sub-circuit 1, the first transistor M1 may be an N-type transistor, and the second transistor M2 may be a P-type transistor; in the second discharge sub-circuit 2, the third transistor M3 may be an N-type transistor, and the fourth transistor M4 may be a P-type transistor; and the first electrostatic discharge end V1 is coupled with a low potential reference voltage line VGL, and the second electrostatic discharge end V2 is coupled with a high potential reference voltage line VGH.

In the solution of the above embodiment one, when the positive voltage generated by the electrostatic charges accumulated on the signal lines L is very large, the voltage of the gate G2 of the P-type second transistor M2 in the first discharge sub-circuit 1 is relatively small and the second transistor M2 is opened to form a conducting channel. Since the first transistor M1 is the N-type transistor, and the first transistor M1 is opened to form a conducting channel, the positive voltage on the signal line L is discharged to the low potential reference voltage line VGL through the second transistor M2 and the first transistor M1, i.e. the signal line L is conducted with the low potential reference voltage line VGL, thus effective electrostatic discharge can be performed for the positive voltage generated by the electrostatic charges accumulated on the signal line L. When the negative voltage generated by the electrostatic charges accumulated on signal line L is very small (the absolute value is very large), the voltage of the gate G3 of the N-type third transistor M3 in the second discharge sub-circuit 2 is relatively large and the third transistor M3 is opened to form a conducting channel. Since the fourth transistor M4 is the P-type transistor and the fourth transistor M4 is opened to form a conducting channel, the negative voltage on the signal line L is discharged to the high potential reference voltage line VGH through the third transistor M3 and the fourth transistor M4, i.e. the signal line L is conducted with the high potential reference voltage line VGH, and thus effective electrostatic discharge can be performed for the negative voltage generated by the electrostatic charges accumulated on the signal line L.

Therefore, the electrostatic protection circuit provided in embodiment one of the present disclosure is capable of performing effective electrostatic discharge of the positive voltage or the negative voltage generated by the electrostatic charges accumulated on signal lines L without influencing the realization of its normal functions.

Second Embodiment

Figure 2:
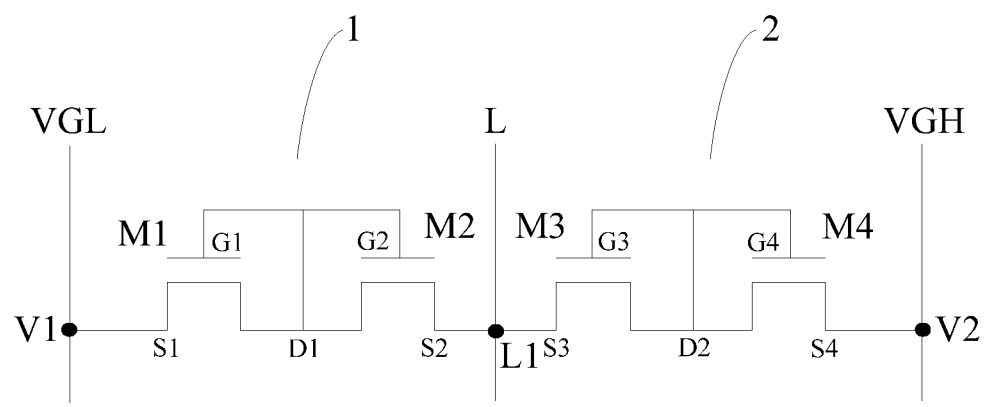
FIG. 2 is another schematic structure diagram of an electrostatic protection circuit provided by an embodiment of the present disclosure.

In an implementation, in the above electrostatic protection circuit provided by the embodiment of the present disclosure, as shown in FIG. 2, in the first discharge sub-circuit 1, a second transistor M2 may be an N-type transistor, and the ion doping concentration of an active layer of a first transistor M1 is greater than the ion doping concentration of an active layer of the second transistor M2, i.e. in a process of preparing the first transistor M1, the active layer of the first transistor M1 is doped with the higher ion concentration as compared with an active layer of a transistor which operates as a switch. In this manner, the first transistor M1 is equivalent to one resistor;

in the second discharge sub-circuit 2, a fourth transistor M4 may be an N-type transistor, and the ion doping concentration of an active layer of a third transistor M3 is greater than the ion doping concentration of an active layer of the fourth transistor M4, i.e. in a process of preparing the third transistor M3, the active layer of the third transistor M3 is doped with the higher ion concentration as compared with the active layer of the transistor which operates as a switch. In this manner, the third transistor M3 is equivalent to one resistor.

In an implementation, in the above electrostatic protection circuit provided by the embodiment of the present disclosure, as shown in FIG. 2, the transistors with the higher ion doping concentration may be N-type transistors or P-type transistors. Specifically, the first transistor M1 may be an N-type transistor or a P-type transistor, and the third transistor M3 may be an N-type transistor or a P-type transistor. Specifically, in FIG. 2, the first transistor M1 and the third transistor M3 being the N-type transistors are taken as examples; and the first electrostatic discharge end V1 is coupled with a low potential reference voltage line VGL, and the second electrostatic discharge end V2 is coupled with a high potential reference voltage line VGH.

It should be noted that the manner of coupling all the transistors in FIG. 2 of second embodiment is the same as coupling manner of all the transistors in FIG. 1 of first embodiment, except for the types of the transistors being different. Therefore, the coupling relationship of all the transistors in FIG. 2 may be referred to the description in FIG. 1 and will not be repeated herein.

In the solution of the above second embodiment, when the positive voltage generated by the electrostatic charges accumulated on the signal line L is very large, since the third transistor M3 is equivalent to a resistor, the positive voltage on the signal line L is discharged to the gate G4 of the fourth transistor M4 through the third transistor M3, the N-type fourth transistor M4 is opened to form a conducting channel, and the positive voltage on the signal line L is discharged to the high potential reference voltage line VGH through the fourth transistor M4, i.e. the signal line L is conducted with the high potential reference voltage line VGH, and thus effective electrostatic discharge can be performed on the positive voltage generated by the electrostatic charges accumulated on the signal line L. When the negative voltage generated by the electrostatic charges accumulated on the signal line L is very small (the absolute value is very large), the positive voltage of the gate G2 of the second transistor M2 is relatively large, and the second transistor M2 is opened to form a conducting channel. Since the first transistor M1 is equivalent to the resistor, the negative voltage on the signal line L is discharged to the low potential reference voltage line VGL through the second transistor M2 and the first transistor M1, i.e. the signal line L is conducted with the low potential reference voltage line VGL, and thus effective electrostatic discharge is performed on the negative voltage generated by the electrostatic charges accumulated on the signal line L.

Therefore, the electrostatic protection circuit provided in embodiment two of the present disclosure is capable of performing effective electrostatic discharge of the positive voltage or the negative voltage generated by the electrostatic charges accumulated on the signal lines L without influencing the realization of its normal functions.

Third Embodiment

In an implementation, in the above electrostatic protection circuit provided by the embodiment of the present disclosure, the gates of transistors in the first discharge sub-circuit and the second discharge sub-circuit are both floating. Specifically, as shown in FIG. 3, the first discharge sub-circuit 1 includes a first transistor M1 and a second transistor M2, a gate G1 of the first transistor M1 and a gate G2 of the second transistor M2 are both floating, a source electrode S1 of the first transistor M1 is coupled with the first electrostatic discharge end V1 and a source electrode S2 of the second transistor M2 is coupled with the signal line connecting end L1;

the second discharge sub-circuit 2 includes a third transistor M3 and a fourth transistor M4, a gate G3 of the third transistor M3 and a gate G4 of the fourth transistor M4 are both floating, a source electrode S3 of the third transistor M3 is coupled with the signal line connecting end L1 and a source electrode S4 of the fourth transistor M4 is coupled with the second electrostatic discharge end V2.

Figure 3:
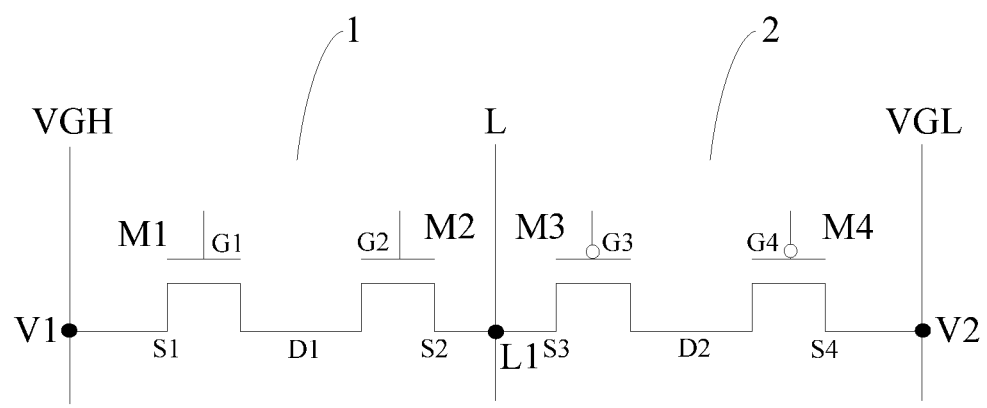
FIG. 3 is another schematic structure diagram of an electrostatic protection circuit provided by an embodiment of the present disclosure.

In an implementation, in the above electrostatic protection circuit provided by the embodiment of the present disclosure, as shown in FIG. 3, in the first discharge sub-circuit 1, the first transistor M1 may be an N-type transistor, and the second transistor M2 may be an N-type transistor; in the second discharge sub-circuit 2, the third transistor M3 may be a P-type transistor and the fourth transistor M4 may be a P-type transistor; and the first electrostatic discharge end V1 is coupled with a high potential reference voltage line VGH and the second electrostatic discharge end V2 is coupled with a low potential reference voltage line VGL.

In the solution of the above third embodiment, when the positive voltage generated by the electrostatic charges accumulated on the signal line L is very large, the voltage of the gate G3 of the P-type third transistor M3 and the voltage of the gate G4 of the fourth transistor M4 in the second discharge sub-circuit 2 are relatively small, and the third transistor M3 and the fourth transistor M4 are opened to form conducting channels. The positive voltage on the signal line L is discharged to the low potential reference voltage line VGL through the third transistor M3 and the fourth transistor M4, i.e. the signal line L is conducted with the low potential reference voltage line VGL, thus effective electrostatic discharge can be performed on the positive voltage generated by the electrostatic charges accumulated on the signal lines L. When the negative voltage generated by the electrostatic charges accumulated on the signal lines L is very small (the absolute value is very large), the voltage of the gate G2 of the N-type second transistor M2 in the first discharge sub-circuit 1 and the voltage of the gate G1 of the first transistor M1 are relatively large, the second transistor M2 and the first transistor M1 are both opened to form conducting channels, and the negative voltage on the signal lines L is discharged to the high potential reference voltage line VGH through the second transistor M2 and the first transistor M1, i.e. the signal lines L is conducted with the high potential reference voltage line VGH, thus effective electrostatic discharge can be performed on the negative voltage generated by the electrostatic charges accumulated on the signal lines L.

Therefore, the electrostatic protection circuit provided in embodiment three of the present disclosure is capable of performing effective electrostatic discharge of the positive voltage or the negative voltage generated by the electrostatic charges accumulated on signal line L without influencing the realization of its normal functions.

Fourth Embodiment

In an implementation, in the above electrostatic protection circuit provided by the embodiment of the present disclosure, in each of the first discharge sub-circuit 1 and the second discharge sub-circuit 2, the gate of one transistor is coupled with the common drain electrode between the two transistors in series connection, and the gate of the other transistor is floating.

Figure 4:
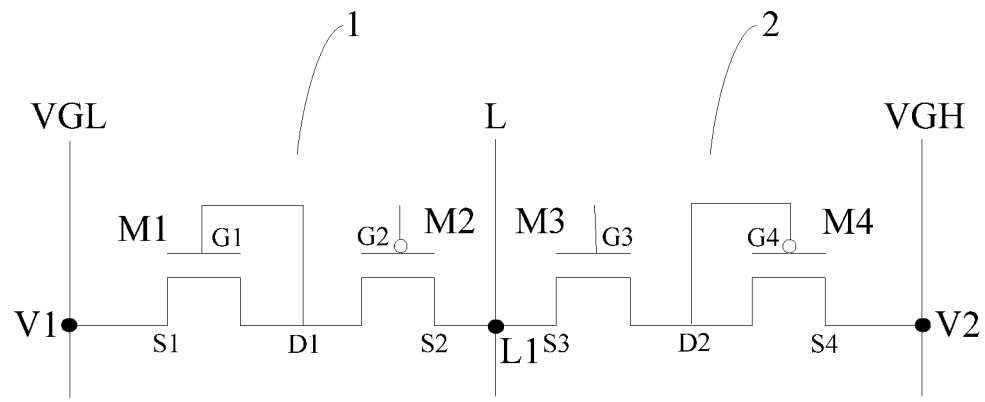
FIG. 4 is another schematic structure diagram of an electrostatic protection circuit provided by an embodiment of the present disclosure.

Specifically, as shown in FIG. 4, the first discharge sub-circuit 1 includes a first transistor M1 and a second transistor M2, a source electrode S1 of the first transistor M1 is coupled with the first electrostatic discharge end V1, the gate G1 of the first transistor M1 is coupled with the first common drain electrode D1 between the first transistor M1 and the second transistor M2 in series connection, the gate G2 of the second transistor M2 is floating, and a source electrode S2 of the second transistor M2 is coupled with the signal line connecting end L1;

the second discharge sub-circuit 2 includes a third transistor M3 and a fourth transistor M4, the gate G3 of the third transistor M3 is floating, a source electrode S3 of the third transistor M3 is coupled with the signal line connecting end L1, the gate G4 of the fourth transistor is coupled with the second common drain electrode D2 between the third transistor M3 and the fourth transistor M4 in series connection, and a source electrode S4 of the fourth transistor M4 is coupled with the second electrostatic discharge end V2.

In an implementation, in the above electrostatic protection circuit provided by the embodiment of the present disclosure, as shown in FIG. 4, in the first discharge sub-circuit 1, the first transistor M1 may be an N-type transistor, and the second transistor M2 may be a P-type transistor; in the second discharge sub-circuit 2, the third transistor M3 may be an N-type transistor and the fourth transistor M4 may be a P-type transistor; and the first electrostatic discharge end V1 is coupled with a low potential reference voltage line VGL and the second electrostatic discharge end V2 is coupled with a high potential reference voltage line VGH.

In the solution of the above fourth embodiment four, when the positive voltage generated by the electrostatic charges accumulated on the signal lines L is very large, the voltage of the gate G2 of the P-type second transistor M2 in the first discharge sub-circuit 1 is relatively small and the second transistor M2 is opened to form a conducting channel. Since the first transistor M1 is an N-type transistor and the first transistor M1 is opened to form a conducting channel, the positive voltage on the signal lines L is discharged to the low potential reference voltage line VGL through the second transistor M2 and the first transistor M1, i.e. the signal lines L are conducted with the low potential reference voltage line VGL, thus effective electrostatic discharge can be performed on the positive voltage generated by the electrostatic charges accumulated on the signal line L. When the negative voltage generated by the electrostatic charges accumulated on the signal lines L is very small (the absolute value is very large), the voltage of the gate G3 of the N-type third transistor M3 in the second discharge sub-circuit 2 is relatively large, and the third transistor M3 is opened to form a conducting channel. Since the fourth transistor M4 is a P-type transistor and the fourth transistor M4 is opened to form a conducting channel, the negative voltage on the signal line L is discharged to the high potential reference voltage line VGH through the third transistor M3 and the fourth transistor M4, i.e. the signal lines are conducted with the high potential reference voltage line VGH, and thus effective electrostatic discharge can be performed on the negative voltage generated by the electrostatic charges accumulated on the signal lines L.

Therefore, the electrostatic protection circuit provided in embodiment four of the present disclosure is capable of performing effective electrostatic discharge of the positive voltage or the negative voltage generated by the electrostatic charges accumulated on signal line L without influencing the realization of its normal functions.

Fifth Embodiment

Figure 5:
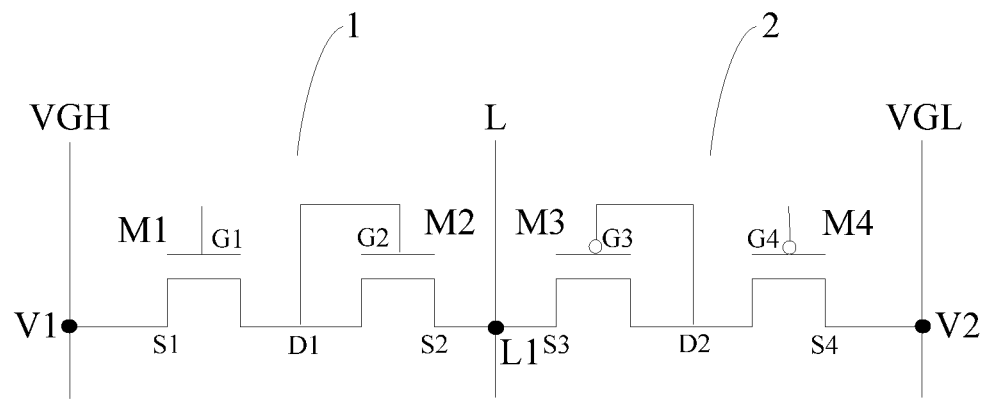
FIG. 5 is another schematic structure diagram of an electrostatic protection circuit provided by an embodiment of the present disclosure.

In an implementation, in the above electrostatic protection circuit provided by the embodiment of the present disclosure, as shown in FIG. 5, the first discharge sub-circuit 1 includes a first transistor M1 and a second transistor M2, a gate G1 of the first transistor M1 is floating, a source electrode S1 of the first transistor M1 is coupled with the first electrostatic discharge end V1, a gate G2 of the second transistor M2 is coupled with the first common drain electrode D1 between the first transistor M1 and the second transistor M2 in series connection, and a source electrode S2 of the second transistor M2 is coupled with the signal line connecting end L1;

the second discharge sub-circuit 2 includes a third transistor M3 and a fourth transistor M4, a gate G3 of the third transistor M3 is coupled with the second common drain electrode D2 between the third transistor M3 and the fourth transistor M4 in series connection, a source electrode S3 of the third transistor M3 is coupled with the signal line connecting end L1, a gate G4 of the fourth transistor M4 is floating, and a source electrode S4 of the fourth transistor M4 is coupled with the second electrostatic discharge end V2.

In an implementation, in the above electrostatic protection circuit provided by the embodiment of the present disclosure, as shown in FIG. 5, in the first discharge sub-circuit 1, the first transistor M1 may be an N-type transistor, and the second transistor M2 may be an N-type transistor; in the second discharge sub-circuit 2, the third transistor M3 may be a P-type transistor and the fourth transistor M4 may be a P-type transistor; and the first electrostatic discharge end V1 is coupled with a high potential reference voltage line VGH and the second electrostatic discharge end V2 is coupled with a low potential reference voltage line VGL.

In the solution of the above fifth embodiment, when the positive voltage generated by the electrostatic charges accumulated on the signal line L is very large, the voltage of the gate G3 of the P-type third transistor M3 in the second discharge sub-circuit 2 and the voltage of the gate G4 of the fourth transistor M4 are relatively small, the third transistor M3 and the fourth transistor M4 are opened to form conducting channels, the positive voltage on the signal line L is discharged to the low potential reference voltage line VGL through the third transistor M3 and the fourth transistor M4, i.e. the signal line L is conducted with the low potential reference voltage line VGL, and thus effective electrostatic discharge can be performed on the positive voltage generated by the electrostatic charges accumulated on the signal line L1. When the negative voltage generated by the electrostatic charges accumulated on the signal lines L is very small (the absolute value is very large), the voltage of the gate G2 of the N-type second transistor M2 in the first discharge sub-circuit 1 and the voltage of the gate G1 of the first transistor M1 are relatively large, the second transistor M2 and the first transistor M2 are both opened to form conducting channels, and the negative voltage on the signal lines L is discharged to the high potential reference voltage line VGH through the second transistor M2 and the first transistor M1, i.e. the signal lines are conducted with the high potential reference voltage line VGH, and thus effective electrostatic discharge can be performed on the negative voltage generated by the electrostatic charges accumulated on the signal line L.

Therefore, the electrostatic protection circuit provided in embodiment five of the present disclosure is capable of performing effective electrostatic discharge of the positive voltage or the negative voltage generated by the electrostatic charges accumulated on signal line L without influencing realization of its normal functions.

Sixth Embodiment

Figure 6:
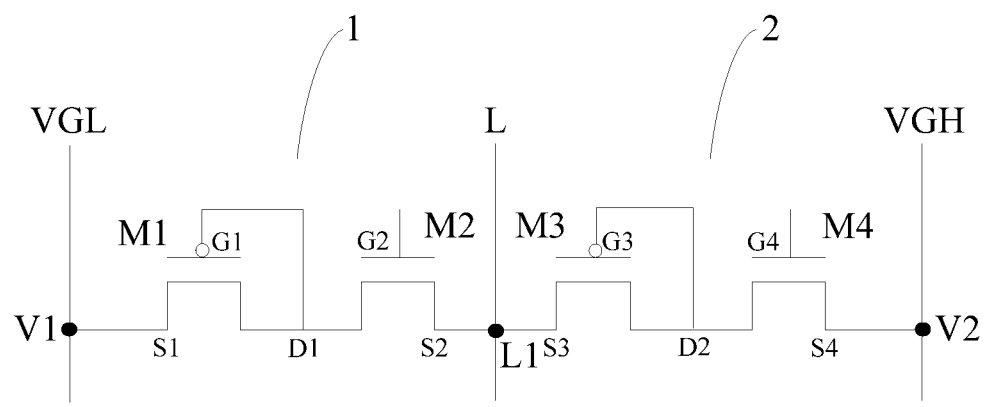
FIG. 6 is another schematic structure diagram of an electrostatic protection circuit provided by an embodiment of the present disclosure.

In an implementation, in the above electrostatic protection circuit provided by the embodiment of the present disclosure, as shown in FIG. 6, the first discharge sub-circuit 1 includes a first transistor M1 and a second transistor M2, a source electrode 51 of the first transistor M1 is coupled with the first electrostatic discharge end V1, a gate G1 of the first transistor M1 is coupled with the first common drain electrode D1 between the first transistor M1 and the second transistor M2 in series connection, a gate G2 of the second transistor M2 is floating, and a source electrode S2 of the second transistor M2 is coupled with the signal line connecting end L1;

the second discharge sub-circuit 2 includes a third transistor M3 and a fourth transistor M4, a gate G3 of the third transistor M3 is coupled with the second common drain electrode D2 between the third transistor M3 and the fourth transistor M4 in series connection, a gate G4 of the fourth transistor M4 is floating, a source electrode S3 of the third transistor M3 is coupled with the signal line connecting end L1, and a source electrode S4 of the fourth transistor M4 is coupled with the second electrostatic discharge end V2.

In an implementation, in the above electrostatic protection circuit provided by the embodiment of the present disclosure, as shown in FIG. 6, in the first discharge sub-circuit 1, the first transistor M1 may be a P-type transistor, and the ion doping concentration of an active layer of the second transistor M2 is greater than the ion doping concentration of an active layer of the first transistor M1, i.e. in a process of preparing the second transistor M2, the active layer of the second transistor M2 is doped with the higher ion concentration as compared with an active layer of a transistor which operates as a switch. In this manner, the second transistor M2 is equivalent to one resistor.

In the second discharge sub-circuit 2, the third transistor M3 may be a P-type transistor, and the ion doping concentration of an active layer of the fourth transistor M4 is greater than the ion doping concentration of an active layer of the third transistor M3, i.e. in a process of preparing the fourth transistor M4, the active layer of the fourth transistor M4 is doped with the higher ion concentration as compared with the active layer of the transistor which operates as a switch. In this manner, the fourth transistor M4 is equivalent to a resistor.

In an implementation, in the above electrostatic protection circuit provided by the embodiment of the present disclosure, the transistors with the higher ion doping concentration may be N-type transistors or P-type transistors. Specifically, as shown in FIG. 6, the second transistor M2 may be an N-type transistor or a P-type transistor, and the fourth transistor M4 may be an N-type transistor or a P-type transistor. In FIG. 6, the second transistor M2 and the fourth transistor M4 being N-type transistor are taken as examples; the first electrostatic discharge end V1 is coupled with a low potential reference voltage line VGL and the second electrostatic discharge end V2 is coupled with a high potential reference voltage line VGH.

In the solution of the above sixth embodiment six, when the positive voltage generated by the electrostatic charges accumulated on the signal lines L is very large, the voltage of the gate G3 of the third transistor M3 is relatively small and the third transistor M3 is opened to form a conducting channel. Since the fourth transistor M4 is equivalent to the resistor, the positive voltage on the signal lines L is discharged to the high potential reference voltage line VGH through the third transistor M3 and the fourth transistor M4, i.e. the signal line L is conducted with the high potential reference voltage line VGH, and thus effective electrostatic discharge can be performed on the positive voltage generated by the electrostatic charges accumulated on the signal line L. When the negative voltage generated by the electrostatic charges accumulated on the signal line L is very small (the absolute value is very large), since the second transistor M2 is equivalent to the resistor and the first transistor M1 is a P-type transistor, the first transistor M1 is opened to form a conducting channel, and thus the negative voltage on the signal line L is discharged to the low potential reference voltage line VGL through the second transistor M2 and the first transistor M1, i.e. the signal lines L are conducted with the low potential reference voltage line VGL, and thus effective electrostatic discharge can be performed on the negative voltage generated by the electrostatic charges accumulated on the signal line L.

Therefore, the electrostatic protection circuit provided in embodiment six of the present disclosure is capable of performing effective electrostatic discharge of the positive voltage or the negative voltage generated by the electrostatic charges accumulated on signal line L without influencing realization of its normal functions.

Seventh Embodiment

Figure 7:
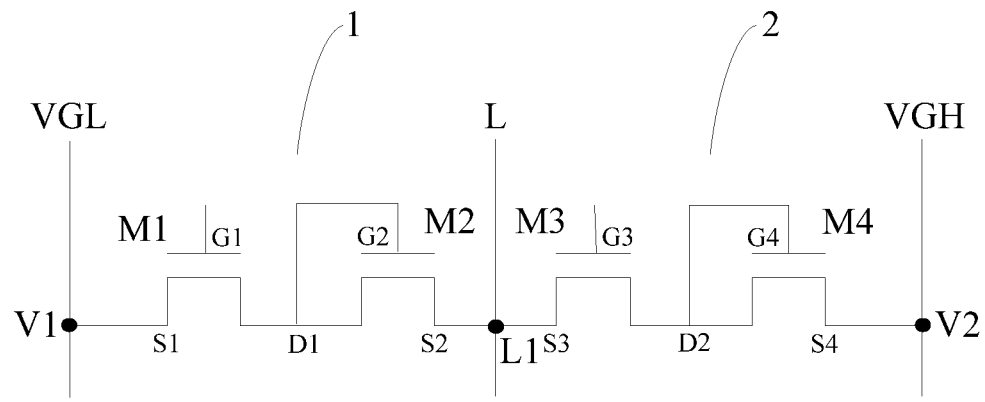
FIG. 7 is another schematic structure diagram of an electrostatic protection circuit provided by an embodiment of the present disclosure.

In an implementation, in the above electrostatic protection circuit provided by the embodiment of the present disclosure, as shown in FIG. 7, the first discharge sub-circuit 1 includes a first transistor M1 and a second transistor M2, a gate G1 of the first transistor M1 is floating, a source electrode S1 of the first transistor M1 is coupled with the first electrostatic discharge end V1, a gate G2 of the second transistor M2 is coupled with the first common drain electrode D1 between the first transistor M1 and the second transistor M2 in series connection, and a source electrode S2 of the second transistor M2 is coupled with the signal line connecting end L1;

the second discharge sub-circuit 2 includes a third transistor M3 and a fourth transistor M4, a gate G3 of the third transistor M3 is floating, a gate G4 of the fourth transistor M4 is coupled with the second common drain electrode D2 between the third transistor M3 and the fourth transistor M4 in series connection, a source electrode S3 of the third transistor M3 is coupled with the signal line connecting end L1 and a source electrode S4 of the fourth transistor M4 is coupled with the second electrostatic discharge end V2.

In an implementation, in the above electrostatic protection circuit provided by the embodiment of the present disclosure, as shown in FIG. 7, in the first discharge sub-circuit 1, the second transistor M2 may be an N-type transistor, and the ion doping concentration of an active layer of the first transistor M1 is greater than the ion doping concentration of an active layer of the second transistor M2, i.e. in a process of preparing the first transistor M1, the active layer of the first transistor M1 is doped with the higher ion concentration as compared with an active layer of a transistor which operates as a switch. In this manner, the first transistor M1 is equivalent to one resistor.

In the second discharge sub-circuit 2, the fourth transistor M4 may be an N-type transistor, and the ion doping concentration of an active layer of the third transistor M3 is greater than the ion doping concentration of an active layer of the fourth transistor M4, i.e. in the process of preparing the third transistor M3, the active layer of the third transistor M3 is doped with the higher ion concentration as compared with the active layer of the transistor which operates as a switch. In this manner, the third transistor M3 is equivalent to one resistor.

In an implementation, in the above electrostatic protection circuit provided by the embodiment of the present disclosure, the transistors with the high ion doping concentration may be N-type transistors or P-type transistors. Specifically, as shown in FIG. 7, the first transistor M1 may be an N-type transistor or a P-type transistor, and the third transistor M3 may be an N-type transistor or a P-type transistor. In FIG. 7, the first transistor M1 and the third transistor M3 being N-type transistor are taken as examples; and the first electrostatic discharge end V1 is coupled with a low potential reference voltage line VGL and the second electrostatic discharge end V2 is coupled with a high potential reference voltage line VGH.

In the solution of the above seventh embodiment, when the positive voltage generated by the electrostatic charges accumulated on the signal line L is very large, since the third transistor M3 is equivalent to the resistor and the fourth transistor M4 is the N-type transistor, the fourth transistor M4 is opened to form a conducting channel, and thus, the positive voltage on the signal line L is discharged to the high potential reference voltage line VGH through the third transistor M3 and the fourth transistor M4, i.e. the signal line L is conducted with the high potential reference voltage line VGH, and thus effective electrostatic discharge can be performed on the positive voltage generated by the electrostatic charges accumulated on the signal lines L. When the negative voltage generated by the electrostatic charges accumulated on the signal line L is very small (the absolute value is very large), the voltage of the gate G2 of the second transistor M2 is relatively large and the second transistor M2 is opened to form a conducting channel. Since the first transistor M1 is equivalent to the resistor, the negative voltage on the signal line L is discharged to the low potential reference voltage line VGL through the second transistor M2 and the first transistor M1, i.e. the signal lines L are conducted with the low potential reference voltage line VGL, and thus effective electrostatic discharge can be performed on the negative voltage generated by the electrostatic charges accumulated on the signal lines L.

Therefore, the electrostatic protection circuit provided in embodiment seven of the present disclosure is capable of performing effective electrostatic discharge of the positive voltage or the negative voltage generated by the electrostatic charges accumulated on the signal lines L and realization of its normal functions is not influenced.

Eighth Embodiment

In an implementation, in the above electrostatic protection circuit provided by the embodiment of the present disclosure, in the first discharge sub-circuit 1, the gate of one transistor is coupled with the first common drain electrode between the two transistors in series connection, and the gate of the other transistor is floating. In the second discharge sub-circuit, the gates of the two transistors are both coupled with the common drain electrode of the two transistors in series connection; or in the first discharge sub-circuit, the gates of the two transistors are both coupled with the common drain electrode between the two transistors in series connection; in the second discharge sub-circuit, the gate of one transistor is coupled with the second common drain electrode between the two transistors in series connection; and the gate of the other transistor is floating.

Figure 8A:
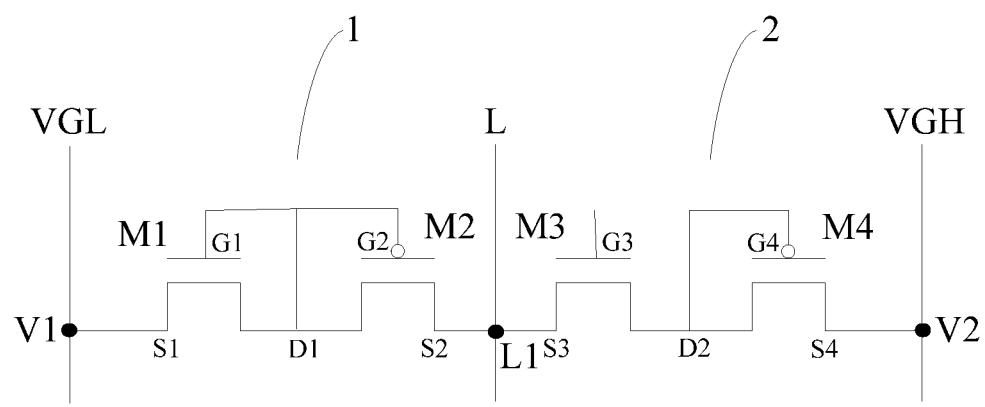
FIG. 8A is another schematic structure diagram of an electrostatic protection circuit provided by an embodiment of the present disclosure.
Figure 8B:
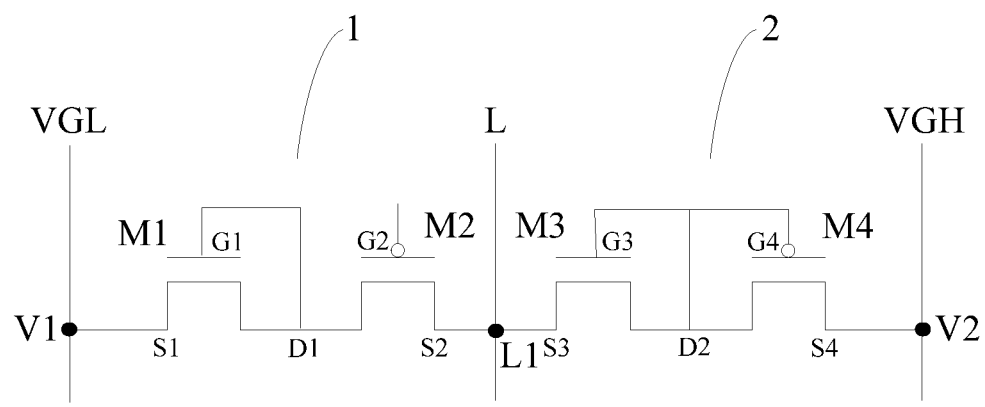
FIG. 8B is another schematic structure diagram of an electrostatic protection circuit provided by an embodiment of the present disclosure.

In an implementation, in the above electrostatic protection circuit provided by the embodiment of the present disclosure, as shown in FIG. 8A, the first discharge sub-circuit 1 includes a first transistor M1 and a second transistor M2, and the second discharge sub-circuit 2 includes a third transistor M3 and a fourth transistor M4, where a source electrode S1 of the first transistor M1 is coupled with the first electrostatic discharge end V1, the gate G1 of the first transistor M1 and the gate G2 of the second transistor M2 are both coupled with the first common drain electrode D1 between the first transistor M1 and the second transistor M2 in series connection, and a source electrode S2 of the second transistor M2 is coupled with the signal line connecting end L1; the gate G3 of the third transistor M3 is floating, a source electrode S3 of the third transistor M3 is coupled with the signal line connecting end L1, the gate G4 of the fourth transistor M4 is coupled with the second common drain electrode D2 between the third transistor M3 and the fourth transistor M4 in series connection, and a source electrode S4 of the fourth transistor M4 is coupled with the second common drain electrode D2, or as shown in FIG. 8B, a source electrode S1 of the first transistor M1 is coupled with the first electrostatic discharge end V1, the gate G1 of the first transistor M1 is coupled with the first common drain electrode D1 between the first transistor M1 and the second transistor M2 in series connection, the gate G2 of the second transistor M2 is floating, and a source electrode S2 of the second transistor M2 is coupled with the signal line connecting end L1; the gate G3 of the third transistor M3 and the gate G4 of the fourth transistor M4 are both coupled with the second common drain electrode D2 between the third transistor M3 and the fourth transistor M4 in series connection, a source electrode S3 of the third transistor M3 is coupled with the signal line connecting end L1, and a source electrode S4 of the fourth transistor M4 is coupled with the second common drain electrode D2.

In an implementation, the principle of electrostatic discharge for the electrostatic protection circuit shown in FIGS. 8A and 8B will not be described in details herein as the above first and fourth embodiments may be referred to.

It should be noted that the gates of the transistors being floating refers to that they are not coupled with any signal line or discharge line.

It should be noted that since the absolute value of the voltage generated by positive charges or negative changes accumulated on the signal lines are far greater than the voltage on the high and low potential reference voltage lines, the positive voltage on the signal lines may be discharged to the high potential reference voltage line and the negative voltage on the signal lines may be discharged to the low potential reference voltage line. Certainly, discharging the positive voltage on the signal lines to the low potential reference voltage line and the negative voltage on the signal lines to the high potential reference voltage line belongs to the protection scope of the embodiments of the present disclosure, such that examples are not provided herein.

It should be noted that the electrostatic protection circuit provided by the present disclosure just gives detailed descriptions about the specific circuit structure drawings of embodiments one to eight and the principles of electrostatic discharge. Certainly, in an implementation, as long as the type of the four transistors in embodiments of the present disclosure, manners of coupling gates of the four transistors and doping concentration of an active layer of a transistor are reasonably disposed, electrostatic discharge on the signal lines may be realized. These deformed electrostatic protection circuits belong to the protection scope of the present disclosure, such that examples are not provided herein.

Based on the same inventive concept disclosed, an embodiment of the present disclosure further provides an array substrate, including a display area and a non-display area surrounding the display area, the display area including a signal line and the non-display area including an electrostatic protection line and further including the any one electrostatic protection circuit provided by the embodiment of the present disclosure, where the signal line connecting end of the electrostatic protection circuit is coupled with the signal lines; and the first electrostatic discharge end and the second electrostatic discharge end of the electrostatic protection circuit are both coupled with the electrostatic protection lines and the coupled electrostatic protection lines may be the same or different and it is not defined herein.

The principles for the above array substrate to solve problems are similar with those of the previous electrostatic protection circuit. Therefore, for the implementation of the array substrate, implementation of the previous electrostatic protection circuit may be referred to and a repeated part is not described herein.

Figure 9A:
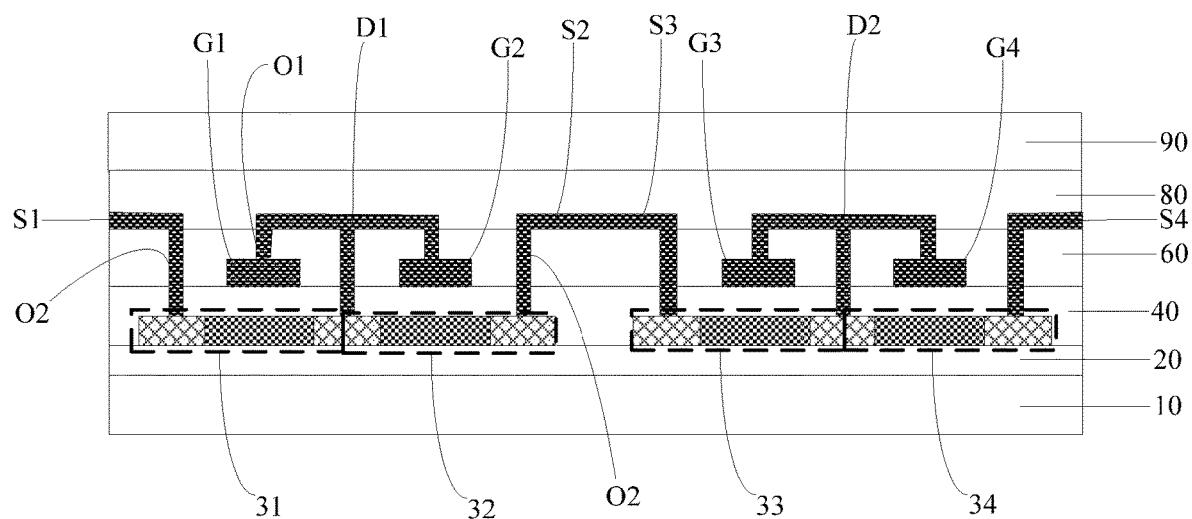
FIG. 9A is a sectional view of an electrostatic protection circuit provided by an embodiment of the present disclosure.
Figure 9B:
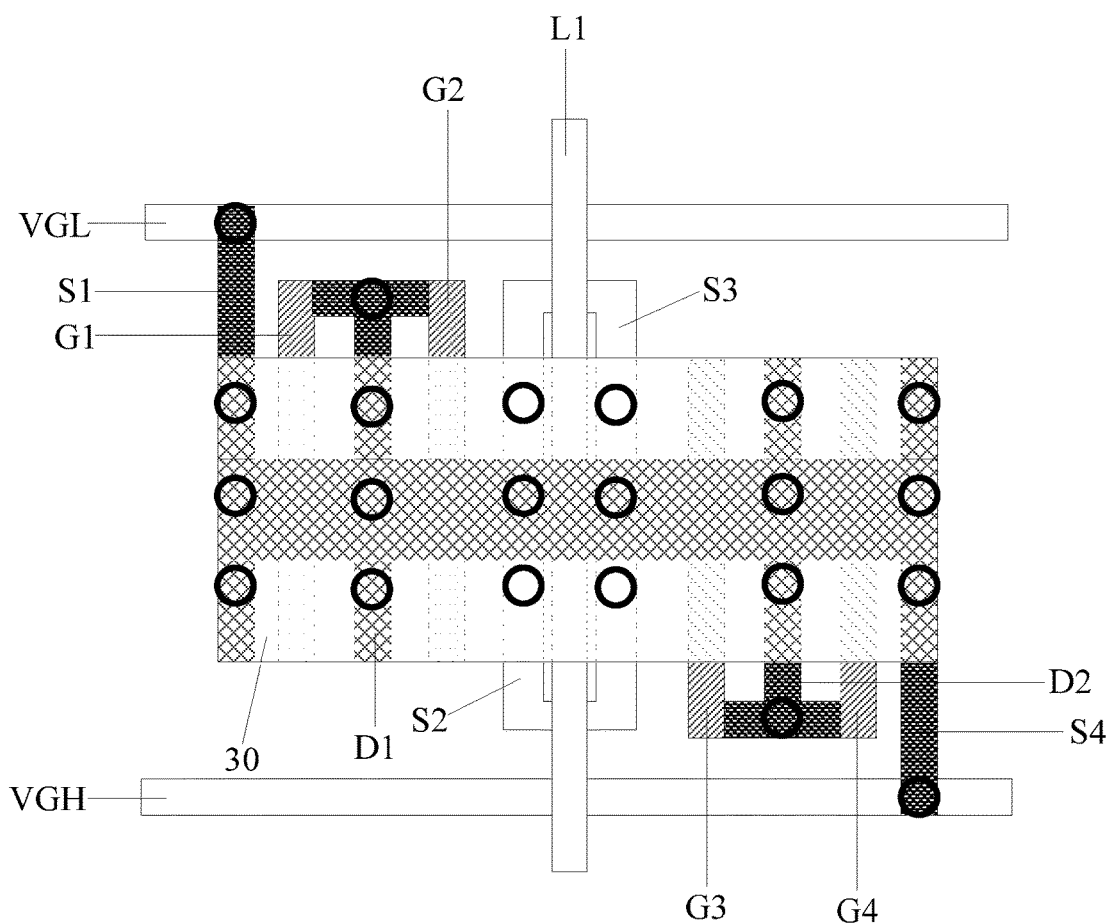
FIG. 9B is a top view of an electrostatic protection circuit provided by an embodiment of the present disclosure.
Figure 10A:
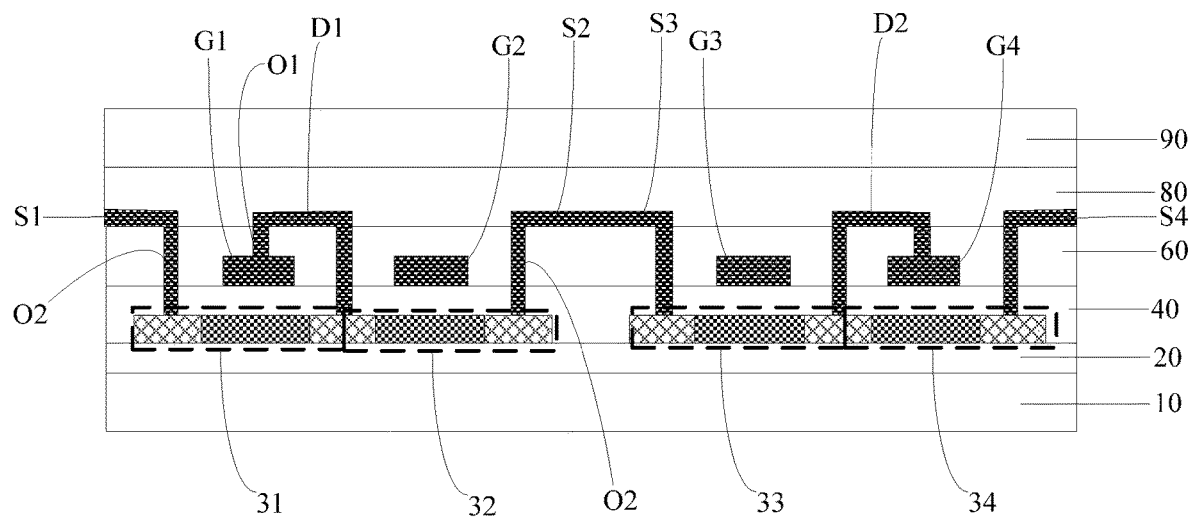
FIG. 10A is another sectional view of an electrostatic protection circuit provided by an embodiment of the present disclosure.
Figure 10B:
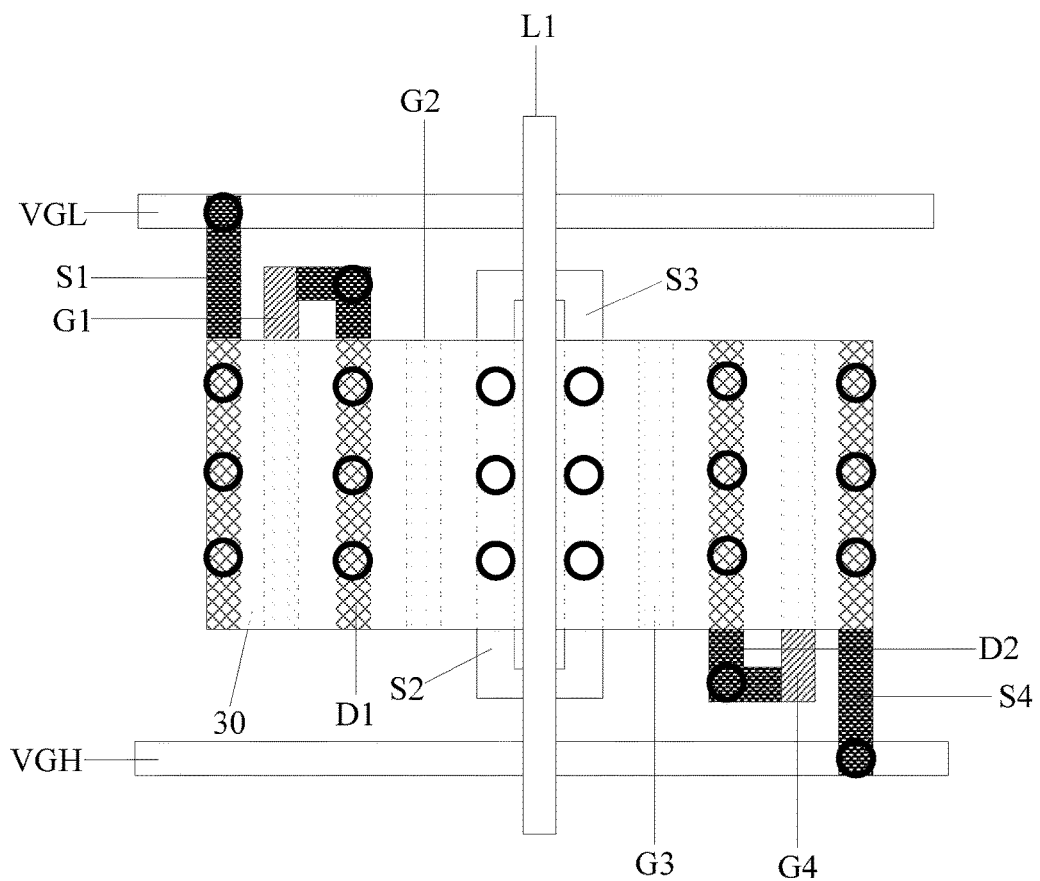
FIG. 10B is another top view of an electrostatic protection circuit provided by an embodiment of the present disclosure.
Figure 11A:
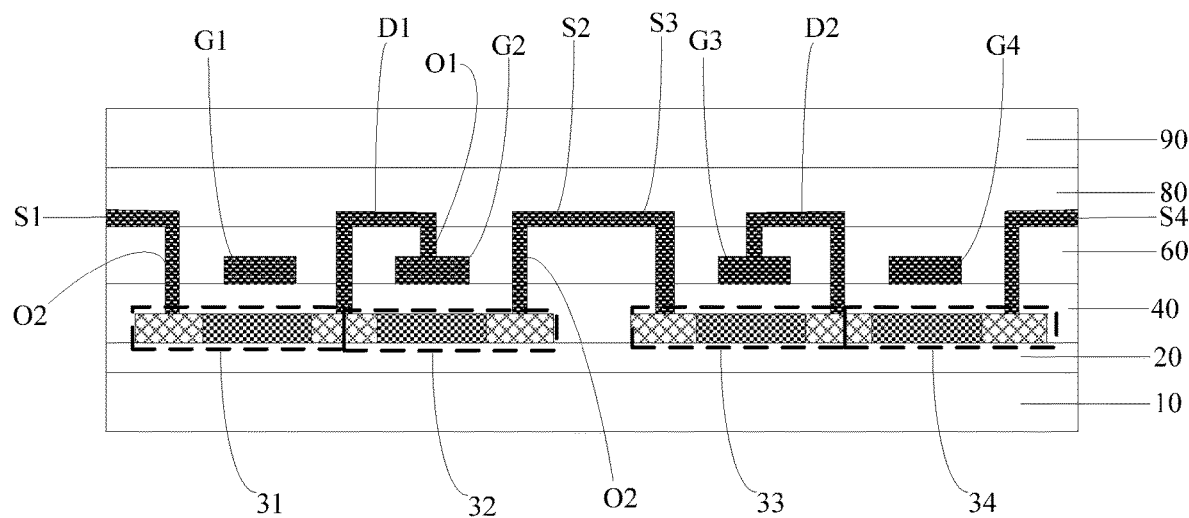
FIG. 11A is another sectional view of an electrostatic protection circuit provided by an embodiment of the present disclosure.
Figure 11B:
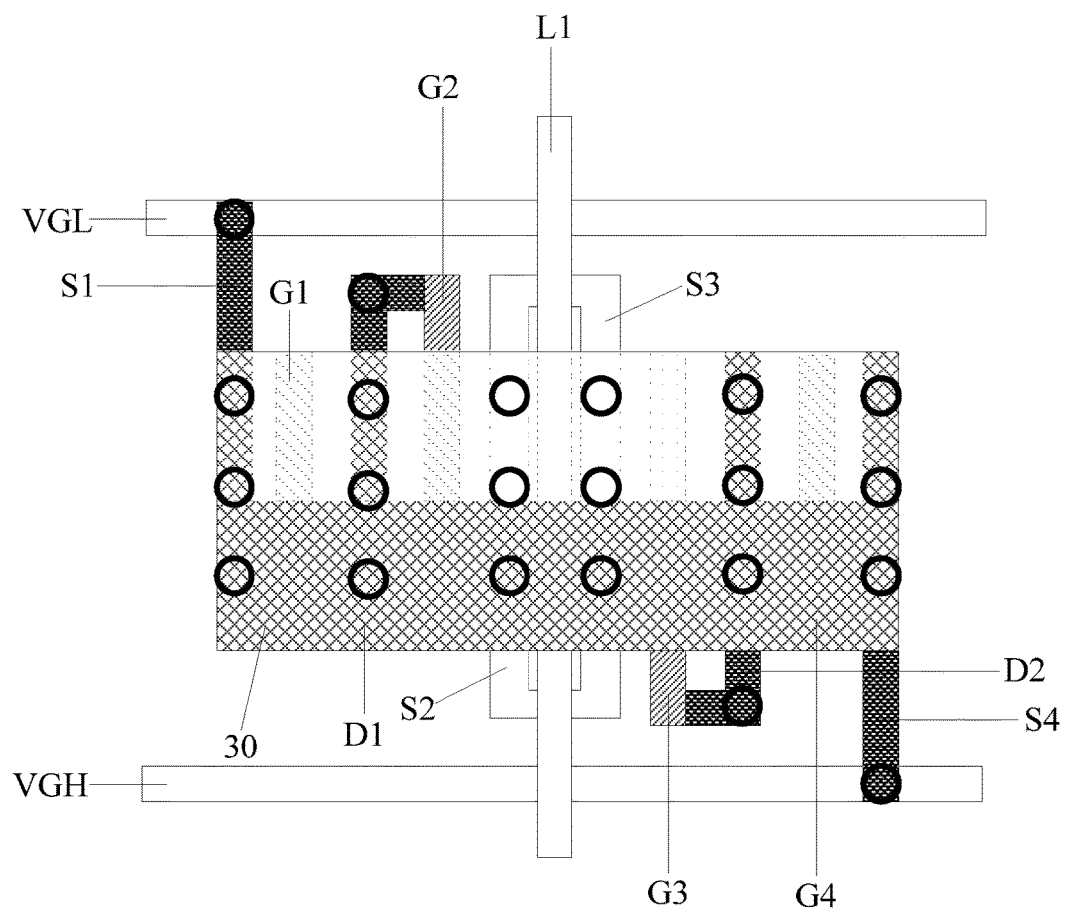
FIG. 11B is another top view of an electrostatic protection circuit provided by an embodiment of the present disclosure.
Figure 12A:
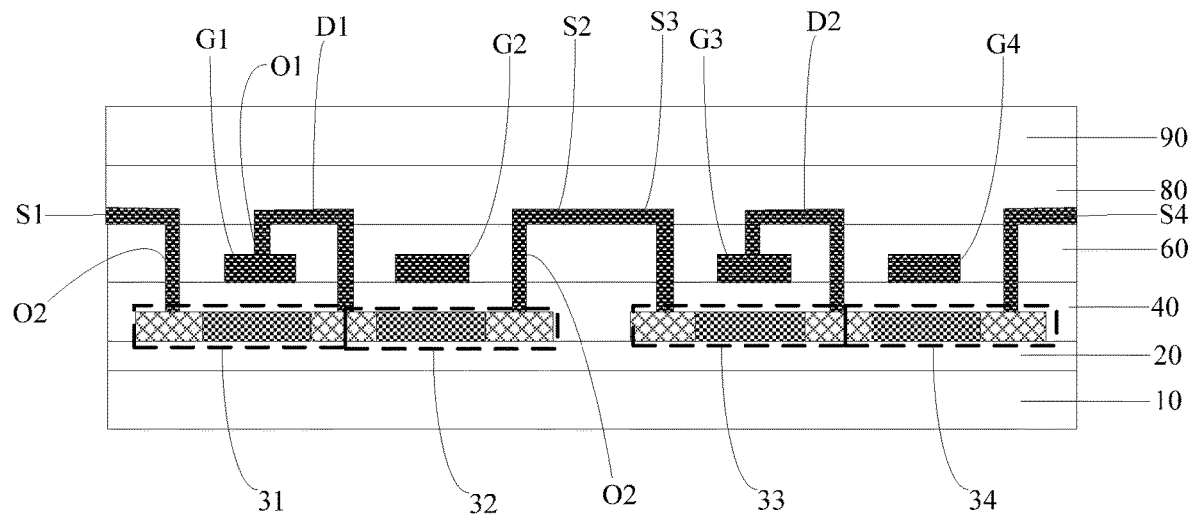
FIG. 12A is another sectional view of an electrostatic protection circuit provided by an embodiment of the present disclosure.
Figure 12B:
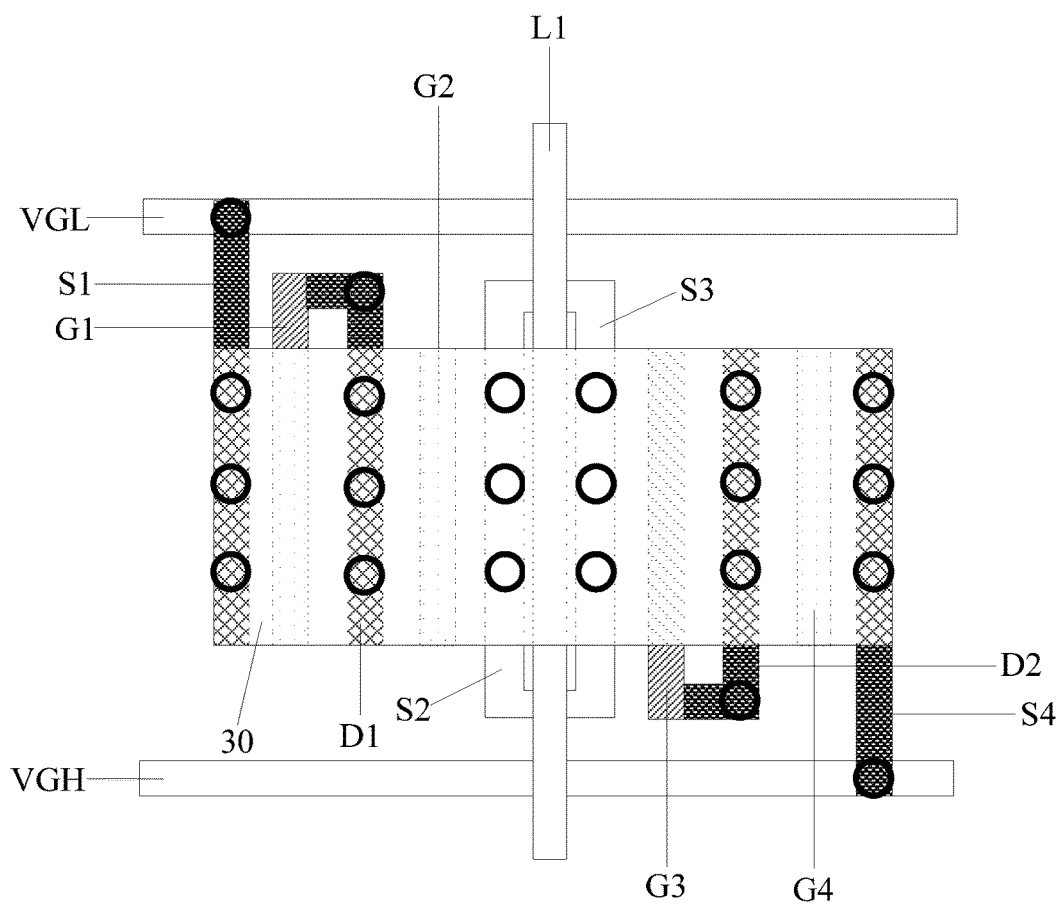
FIG. 12B is another top view of an electrostatic protection circuit provided by an embodiment of the present disclosure.
Figure 13A:
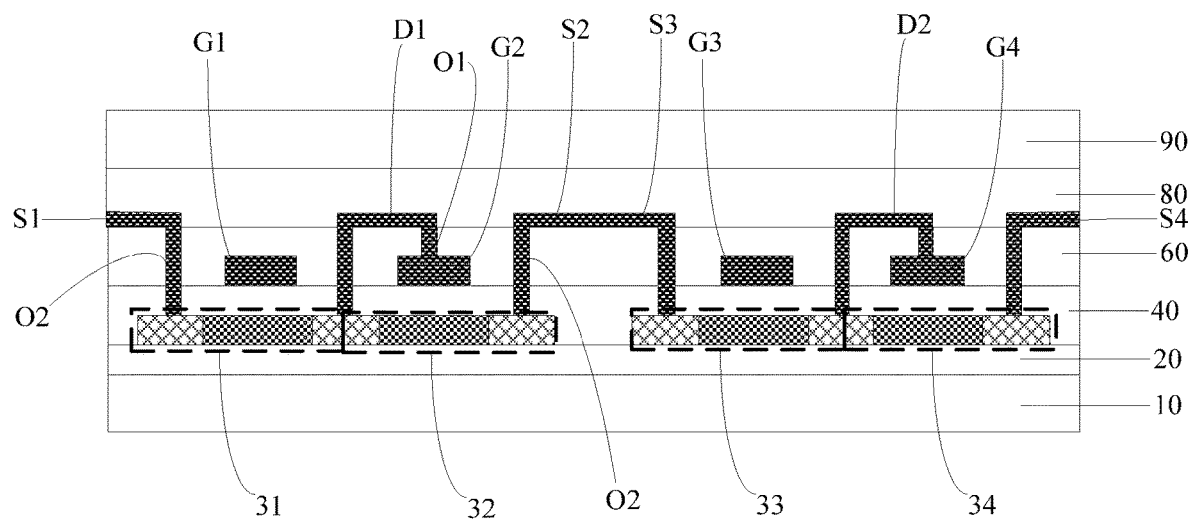
FIG. 13A is another sectional view of an electrostatic protection circuit provided by an embodiment of the present disclosure.
Figure 13B:
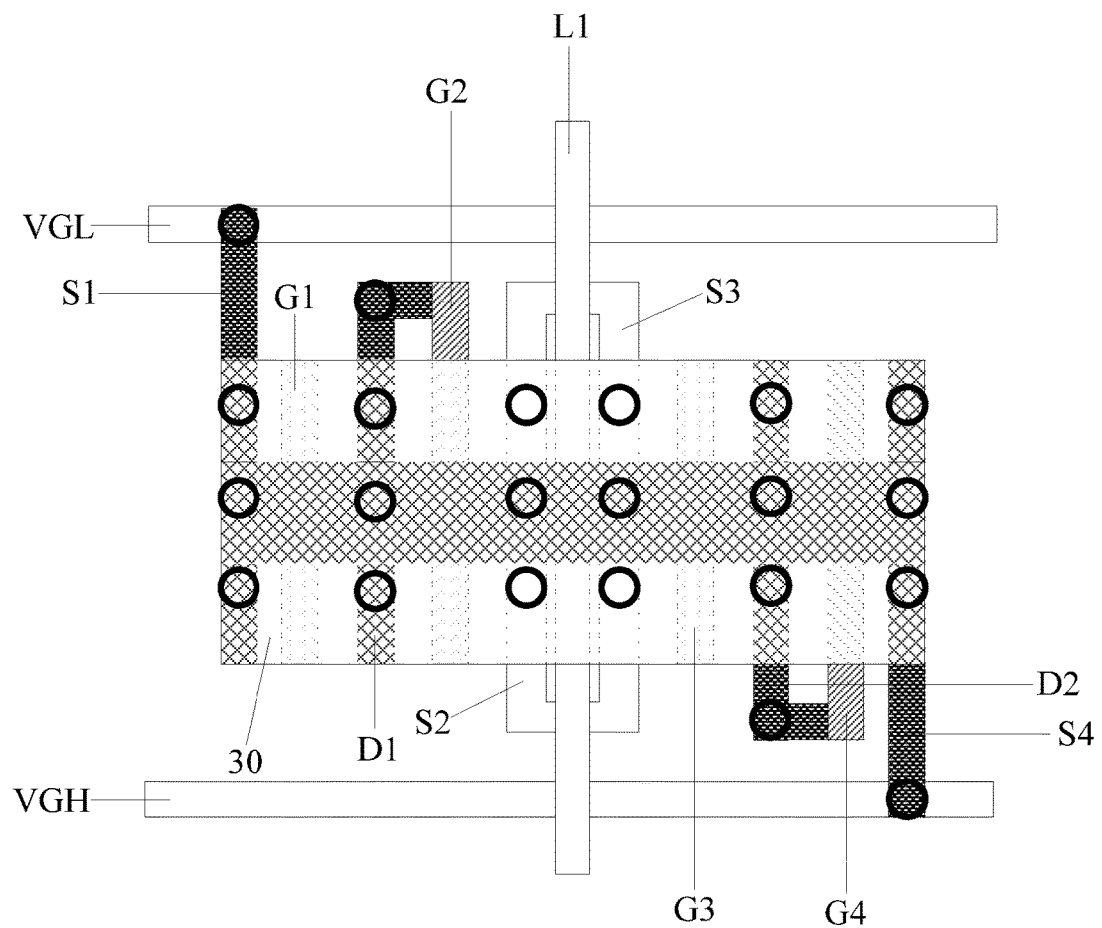
FIG. 13B is another top view of an electrostatic protection circuit provided by an embodiment of the present disclosure.

In an implementation, in the above array substrate provided by the embodiment of the present disclosure, as shown in FIGS. 9A to 13B, FIG. 9A is a sectional view of the electrostatic protection circuit shown in FIGS. 1 and 2 on the substrate; FIG. 9B is a top view of the electrostatic protection circuit provided shown in FIGS. 1 and 2 on the substrate; FIG. 10A is a sectional view of the electrostatic protection circuit provided shown in FIG. 4 on the substrate. 10B is a top view of the electrostatic protection circuit shown in FIG. 4 on the substrate; FIG. 11A is a sectional view of the electrostatic protection circuit shown in FIG. 5 on the substrate; FIG. 11B is a top view of the electrostatic protection circuit shown in FIG. 5 on the substrate; FIG. 12A is a sectional view of the electrostatic protection circuit shown in FIG. 6 on the substrate; FIG. 12B is a top view of the electrostatic protection circuit shown in FIG. 6 on the substrate; FIG. 13A is a sectional view of the electrostatic protection circuit shown in FIG. 7 on the substrate; FIG. 13B is a top view of the electrostatic protection circuit shown in FIG. 7 on the substrate, the array substrate including the substrate 10 and further including a buffer layer 20, a semiconductor layer 30, a gate insulating layer 40, a first metal layer, an interlayer insulating layer 60, a second metal layer, a passivation layer 80 and a planarization layer which are located on the substrate 10 and disposed in a stacked manner sequentially, where the semiconductor layer 30 includes the active layers of all the transistors in the above electrostatic protection circuit provided by the embodiment of the present disclosure. Specifically, the semiconductor layer 30 includes the active layer 31 of the first transistor M1, the active layer 32 of the second transistor M2, the active layer 33 of the third transistor M3 and the active layer 34 of the fourth transistor M4;

the first metal layer includes the gates of all the transistors. Specifically, the first metal layer includes the gate G1 of the first transistor M1, the gate G2 of the second transistor M2, the gate G3 of the third transistor M3 and the gate G4 of the fourth transistor M4;

the second metal layer includes the source electrodes and the drain electrodes of all the transistors. Specifically, the second metal layer includes the source electrode 51 and the drain electrode D1 of the first transistor M1, the source electrode S2 and the drain electrode D1 of the second transistor M2, the source electrode S3 and the drain electrode D2 of the third transistor M3, and the source electrode S4 and the drain electrode D2 of the fourth transistor M4;

The gates, coupled with the common drain electrode of two transistors, of the transistors are coupled with the common drain electrode through via holes running through the interlayer insulating layer, and the source electrodes and the drain electrodes of all the transistors are respectively coupled with the active layers through via holes running through the interlayer insulating layer and the gate insulating layer. Specifically, as shown in FIGS. 9A and 9B, the gate G1 and the gate G2, coupled with the first common drain electrode D1 of the first transistor M1 and the second transistor M2, of the first transistor M1 and the second transistor M2 are coupled with the first common drain electrode D1 through the via holes O1 running through the interlayer insulating layer 60, the gate G3 and the gate G4, coupled with the second common drain electrode D2 of the third transistor M3 and the fourth transistor M4, of the third transistor M3 and the fourth transistor M4 are coupled with the second common drain electrode D1 through the via holes O1 running through the interlayer insulating layer 60, the source electrode 51 and the drain electrode D1 of the first transistor are respectively coupled with the active layers, i.e. the semiconductor layer 30, through via holes O2 running through the interlayer insulating layer 60 and the gate insulating layer 40, the source electrode S2 and the drain electrode D1 of the second transistor are respectively coupled with the active layers, i.e. the semiconductor layer 30 through the via holes O2 running through the interlayer insulating layer 60 and the gate insulating layer 40, the source electrode S3 and the drain electrode D2 of the third transistor are respectively coupled with the active layers, i.e. the semiconductor layer 30, through the via holes O2 running through the interlayer insulating layer 60 and the gate insulating layer 40, and the source electrode S4 and the drain electrode D2 of the fourth transistor are respectively coupled with the active layers, i.e. the semiconductor layer 30 through the via holes O2 running through the interlayer insulating layer 60 and the gate insulating layer 40. Similarly, as for the coupling relationship shown in FIGS. 10A to 13B, refer to the embodiments shown in FIGS. 9A and 9B. What differs is the gates being floating in all the transistors, which is not coupled with any signal line or discharge line.

The electrostatic protection lines (VGH, VGL) are coupled with the source electrodes (S1, S4) of the transistors;

the source electrodes (S2, S3) of the two transistors (the second transistor M2 and the third transistor M3) coupled with the signal line connecting end L1 are coupled with the active layers through the via holes running through the interlayer insulating layer 60 and the gate insulating layer 40 and the signal lines L are coupled with the signal line connecting end L1.

In an implementation, in the above array substrate provided by the embodiment of the present disclosure, in order to simplify a manufacturing process, the active layers of all transistors in the electrostatic protection circuit of the present disclosure are integrally structured, and each transistor is a polycrystalline silicon transistor.

It should be noted that the manner of manufacturing each transistor in the above electrostatic protection circuit provided by the embodiment of the present disclosure is the same in related techniques and it is not described in details herein.

It should be noted that the transistors in the above electrostatic protection circuit provided by the embodiment of the present disclosure may be thin film transistors or field effect transistors or other device with the same characteristics.

In an implementation, in the above array substrate provided by the embodiment of the present disclosure, the extending direction of the source electrodes of all the transistors is disposed parallel with the signal lines and perpendicular to the electrostatic protection line.

In an implementation, in the above array substrate provided by the embodiment of the present disclosure, the signal lines may include a gate line, a data line or a test signal line, wherein the test signal line may include a clock signal line or a touch control signal line. The gate line is taken as an example for illustration in the present disclosure. The principle for electrostatic discharge of other types of signal lines is the same with the principle for electrostatic discharge of the gate line, such that it is not described in details herein. The electrostatic protection line may include a common electrode line, the high potential reference voltage line or the low potential reference voltage line. The present disclosure makes a description with the high potential reference voltage line and the low potential reference voltage line as examples. Certainly, it may also be a common electrode line, which is not described in details herein.

Based on the same inventive concept disclosed, an embodiment of the present disclosure further provides a display device, including any one array substrate provided by the embodiment of the present disclosure. The principles for the above array substrate to solve problems are similar with those of the previous array substrate. Therefore, for the implementation of the display device, implementation of the previous array substrate may be referred to and a repeated part is not described herein.

An embodiment of the present disclosure provides an electrostatic protection circuit, an array substrate and a display device. The electrostatic protection circuit includes: the first electrostatic discharge end, the second electrostatic discharge end, the signal line connecting end, the first discharge sub-circuit coupled between the first electrostatic discharge end and the signal line connecting end, and the second discharge sub-circuit coupled between the second electrostatic discharge end and the signal line connecting end; each of the first discharge sub-circuit and the second discharge sub-circuit includes at least one transistor, and the gates of all transistors are not coupled with the first electrostatic discharge end, the second electrostatic discharge end and the signal line connecting end. In an actual application, the first electrostatic discharge end and the second electrostatic discharge end in the electrostatic protection circuit are respectively coupled with the electrostatic protection lines such as the common electrode line and the high-low potential reference voltage line; the signal line connecting end is coupled with the signal lines such as a grid line and a data line; when the voltage generated by the electrostatic charges accumulated on the signal lines is too large or too small (the absolute value is very large); and the signal lines and the electrostatic protection lines can be conducted through the transistors in the first electrostatic discharge circuit or in the second electrostatic discharge circuit, so that effective electrostatic discharge of the signal lines in a product can be realized without influencing the realization of normal functions of the product.

Obviously, those skilled in the art can make various modifications and variations to the present disclosure without departing from the spirit and scope of the present disclosure. By doing this, if these modifications and variations to the present disclosure belong to the claims of the present disclosure and the range of equivalent techniques thereof, the present disclosure also intends to include these modifications and variations inside.

The invention claimed is:

1. An electrostatic protection circuit, including:
a first electrostatic discharge end, a second electrostatic discharge end and a signal line connecting end;
a first discharge sub-circuit coupled between the first electrostatic discharge end and the signal line connecting end; and
a second discharge sub-circuit coupled between the second electrostatic discharge end and the signal line connecting end;
wherein the first discharge sub-circuit comprises a first Metal-Oxide-Semiconductor Field-Effect Transistor (MOSFET) and a second MOSFET, a source electrode of the first MOSFET is coupled with the first electrostatic discharge end, a source electrode of the second MOSFET is coupled with the signal line connecting end, and a drain electrode of the first MOSFET is connected in series with a drain electrode of the second MOSFET to form a first common drain electrode;
wherein the second discharge sub-circuit comprises a third MOSFET and a fourth MOSFET, a source electrode of the third MOSFET is coupled with the signal line connecting end, a source electrode of the fourth MOSFET is coupled with the second electrostatic discharge end, and a drain electrode of the third MOSFET is connected in series with a drain electrode of the fourth MOSFET to form a second common drain electrode;
wherein gates of all MOSFETs comprised in the first discharge sub-circuit and the second discharge sub-circuit are not coupled with any one of the first electrostatic discharge end, the second electrostatic discharge end and the signal line connecting end.

2. The electrostatic protection circuit of claim 1, wherein a gate of the first MOSFET and a gate of the second MOSFET each is coupled with the first common drain electrode; or
the gate of the first MOSFET and the gate of the second MOSFET each is floating; or
the gate of the first MOSFET is coupled with the first common drain electrode and the gate of the second MOSFET is floating; or
the gate of the first MOSFET is floating, and the gate of the second MOSFET is coupled with the first common drain electrode.

3. The electrostatic protection circuit of claim 2, wherein in a case that the gate of the first MOSFET and the gate of the second MOSFET each is coupled with the first common drain electrode, or in a case that the gate of the first MOSFET is floating, and the gate of the second MOSFET is coupled with the first common drain electrode, the second MOSFET is an N-type MOSFET, and ion doping concentration of an active layer of the first MOSFET is greater than ion doping concentration of an active layer of the second MOSFET.

4. The electrostatic protection circuit of claim 2, wherein in a case that the gate of the first MOSFET and the gate of the second MOSFET each is coupled with the first common drain electrode, or in a case that the gate of the first MOSFET is coupled with the first common drain electrode and the gate of the second MOSFET is floating, the first MOSFET is an N-type MOSFET, the second MOSFET is a P-type MOSFET, the first electrostatic discharge end is coupled with a low potential reference voltage line, and the second electrostatic discharge end is coupled with a high potential reference voltage line.

5. The electrostatic protection circuit of claim 2, wherein in a case that the gate of the first MOSFET and the gate of the second MOSFET each is floating, or in a case that the gate of the first MOSFET is floating, and the gate of the second MOSFET is coupled with the first common drain electrode, the first MOSFET is an N-type MOSFET, the second MOSFET is an N-type MOSFET, the first electrostatic discharge end is coupled with a high potential reference voltage line, and the second electrostatic discharge end is coupled with a low potential reference voltage line.

6. The electrostatic protection circuit of claim 2, wherein in a case that the gate of the first MOSFET is coupled with the first common drain electrode and the gate of the second MOSFET is floating, the first MOSFET is a P-type MOSFET, and ion doping concentration of an active layer of the second MOSFET is greater than ion doping concentration of an active layer of the first MOSFET.

7. The electrostatic protection circuit of claim 1, wherein a gate of the third MOSFET and a gate of the fourth MOSFET each is coupled with the second common drain electrode; or
the gate of the third MOSFET and the gate of the fourth MOSFET each is floating; or
the gate of the third MOSFET is coupled with the second common drain electrode and the gate of the fourth MOSFET is floating; or
the gate of the third MOSFET is floating and the gate of the fourth MOSFET is coupled with the second common drain electrode.

8. The electrostatic protection circuit of claim 7, wherein in a case that the gate of the third MOSFET and the gate of the fourth MOSFET each is coupled with the second common drain electrode, or in a case that the gate of the third MOSFET is floating and the gate of the fourth MOSFET is coupled with the second common drain electrode, the fourth MOSFET is an N-type MOSFET, and ion doping concentration of an active layer of the third MOSFET is greater than ion doping concentration of an active layer of the fourth MOSFET.

9. The electrostatic protection circuit of claim 7, wherein in a case that the gate of the third MOSFET and the gate of the fourth MOSFET each is coupled with the second common drain electrode, or in a case that the gate of the third MOSFET is floating and the gate of the fourth MOSFET is coupled with the second common drain electrode, the third MOSFET is an N-type MOSFET, the fourth MOSFET is a P-type MOSFET, the first electrostatic discharge end is coupled with a low potential reference voltage line, and the second electrostatic discharge end is coupled with a high potential reference voltage line.

10. The electrostatic protection circuit of claim 7, wherein in a case that the gate of the third MOSFET and the gate of the fourth MOSFET each is floating; or in a case that the gate of the third MOSFET is coupled with the second common drain electrode and the gate of the fourth MOSFET is floating, the third MOSFET is a P-type MOSFET, the fourth MOSFET is a P-type MOSFET, the first electrostatic discharge end is coupled with a high potential reference voltage line, and the second electrostatic discharge end is coupled with a low potential reference voltage line.

11. The electrostatic protection circuit of claim 7, wherein in a case that the gate of the third MOSFET and the gate of the fourth MOSFET each is floating; or in a case that the gate of the third MOSFET is coupled with the second common drain electrode and the gate of the fourth MOSFET is floating, the third MOSFET is a P-type MOSFET, and ion doping concentration of an active layer of the fourth MOSFET is greater than ion doping concentration of an active layer of the third MOSFET.

12. The electrostatic protection circuit of claim 3, wherein the MOSFETs with higher ion doping concentration are the N-type MOSFETs or the P-type MOSFETs, the first electrostatic discharge end is coupled with a low potential reference voltage line, and the second electrostatic discharge end is coupled with a high potential reference voltage line.

13. The electrostatic protection circuit of claim 1, wherein a gate of the first MOSFET and a gate of the second MOSFET each is coupled with the first common drain electrode, and a gate of the third MOSFET and a gate of the fourth MOSFET each is coupled with the second common drain electrode; or the gate of the first MOSFET and the gate of the second MOSFET each is floating, and the gate of the third MOSFET and the gate of the fourth MOSFET each is floating; or a gate of one of the first MOSFET and the second MOSFET is coupled with the first common drain electrode, and a gate of other MOSFET is floating; a gate of one of the third MOSFET and the fourth MOSFET is floating, and a gate of other MOSFET is coupled with the second common drain electrode; or the gate of one of the first MOSFET and the second MOSFET is coupled with the first common drain electrode, and the gate of the other MOSFET is floating; the gates of the third MOSFET and the fourth MOSFET both are coupled with the second common drain electrode; or the gates of the first MOSFET and the second MOSFET both are coupled with the first common drain electrode, and the gate of one of the third MOSFET and the fourth MOSFET is coupled with the second common drain electrode and the gate of the other MOSFET is floating.

14. An array substrate, comprising a display area and a non-display area surrounding the display area, the display area comprising signal lines, and the non-display area comprising electrostatic protection lines, wherein the non-display area further comprises the electrostatic protection circuit of claim 1, wherein the signal line connecting end of the electrostatic protection circuit is coupled with the signal lines; and the first electrostatic discharge end and the second electrostatic discharge end of the electrostatic protection circuit are both coupled with the electrostatic protection lines.

15. The array substrate of claim 14, wherein the array substrate comprises a substrate and further comprises a buffer layer, a semiconductor layer, a gate insulating layer, a first metal layer, an interlayer insulating layer, a second metal layer, a passivation layer and a planarization layer stacked on the substrate in that order, wherein the semiconductor layer comprises active layers of respective MOSFETs, the first metal layer comprises gates of respective MOSFETs, and the second metal layer comprises source electrodes and drain electrodes of respective MOSFETs;

the first common drain electrode or the second common drain electrode is coupled with a corresponding gate through a via hole running through the interlayer insulating layer, and the source electrode and the drain electrode are respectively coupled with a corresponding active layer through via holes running through the interlayer insulating layer and the gate insulating layer.

16. The array substrate of claim 15, wherein active layers of all the MOSFETs are integrally structured and each MOSFET is a polycrystalline silicon MOSFET.

17. A display device, wherein the display device comprises the array substrate of claim 14.

* * * * *